United States Patent
Weirauch

[11] Patent Number: 5,828,068
[45] Date of Patent: Oct. 27, 1998

[54] UNCOOLED MERCURY CADMIUM TELLURIDE INFRARED DEVICES WITH INTEGRAL OPTICAL ELEMENTS

[75] Inventor: Donald F. Weirauch, Dallas, Tex.

[73] Assignee: Raytheon TI Systems, Inc., Lewisville, Tex.

[21] Appl. No.: 834,791

[22] Filed: Apr. 3, 1997

Related U.S. Application Data

[60] Provisional application No. 60/014,852 Apr. 4, 1996.

[51] Int. Cl.$^6$ .................................................. H01L 27/146
[52] U.S. Cl. .................................. 250/370.13; 250/338.4
[58] Field of Search .......................... 250/370.13, 370.1, 250/370.08, 349, 338.4, 332; 257/432, 433, 465

[56] References Cited

U.S. PATENT DOCUMENTS

| | | | |
|---|---|---|---|
| 4,296,324 | 10/1981 | Kern et al. | 250/339 |
| 4,370,557 | 1/1983 | Axmark et al. | 250/554 |
| 4,629,892 | 12/1986 | Carmichael et al. | 250/370.13 |
| 4,636,631 | 1/1987 | Carpentier et al. | 250/370.13 |
| 4,691,196 | 9/1987 | Kern et al. | 340/578 |
| 4,769,775 | 9/1988 | Kern et al. | 364/551.01 |
| 4,785,292 | 11/1988 | Kern et al. | 340/578 |
| 5,306,915 | 4/1994 | Matthews | 250/370.13 |

*Primary Examiner*—Edward P. Westin
*Assistant Examiner*—Richard Hanig
*Attorney, Agent, or Firm*—Baker & Botts, L.L.P.

[57] ABSTRACT

This is an uncooled HgCdTe IR sensor, and method of fabricating an uncooled HgCdTe IR sensor. The method comprises; growing an HgCdTe film on an IR transparent substrate, and shaping the substrate into a lens configuration. The HgCdTe IR sensor can comprise an epitaxial, HgCdTe film on an IR transparent substrate, with the substrate shaped in a lens configuration, creating an intregal, controlled (e.g. wide angle) field of view sensor. Reflections at the interface between the HgCdTe and the lens are substantially reduced, and problems of attaching HgCdTe to the lens are also substantially reduced. Preferably, the HgCdTe film is grown by liquid phase epitaxy, the substrate is CdZnTe or CdTe, and/or the substrate is shaped into a hemisphere or a cylindrical section. In one embodiment, an IR transparent overlayer is grown on an HgCdTe film 10 and the substrate is shaped into a hemisphere lens 16 and the IR transparent overlayer is shaped into an hemispherical lens 18. The HgCdTe film may also have a top surface with a non-uniform compositional gradient, to provide an HgCdTe IR sensor which can detect a wide range of optical wavelengths.

21 Claims, 1 Drawing Sheet

UNCOOLED MERCURY CADMIUM TELLURIDE INFRARED DEVICES WITH INTEGRAL OPTICAL ELEMENTS

This application claims priority under 35 U.S.C. §119 of provisional application number 60/014,852 filed Apr. 4, 1996.

CROSS-REFERENCE TO COMMONLY-OWNED, CO-FILED, RELATED APPLICATIONS

The following are commonly-owned, co-filed, related applications, and are incorporated by reference herein; "NARROW BAND INFRARED FILTER DETECTORS" Ser. No. 60/014,826; "MERCURY CADMIUM TELLURIDE INFRARED FILTERS AND DETECTORS AND METHODS OF FABRICATION" Ser. No. 60/014,873; "MERCURY CADMIUM TELLURIDE DEVICES FOR DETECTING AND CONTROLLING OPEN FLAMES" Ser. No. 60/014,852; "UNCOOLED INFRARED SENSORS FOR THE DETECTION AND IDENTIFICATION OF CHEMICAL PRODUCTS OF COMBUSTION" Ser. No. 60/014,809; "A METHOD OF FABRICATING A LATERALLY CONTINUOUSLY GRADED HGCDTE LAYER" Ser. No. 60/014,825; "INTEGRATED IR DETECTOR SYSTEM" Ser. No. 60/014,825; and "NARROW BAND INFRARED FILTER-DETECTORS" Ser. No. 60/014,811.

FIELD OF THE INVENTION

This invention generally relates to devices for the detection of open flames to signal hazardous conditions as well as infrared sensing devices for the control of manufacturing processes and, more specifically, to the design, fabrication and application of such devices heretofore operated at cryogenic temperatures.

BACKGROUND OF THE INVENTION

When materials burn or explode, emission of light in the visible as well as the invisible infrared (IR) and ultraviolet (UV) wavelengths occur. The chemical composition of the burning flame determines the wavelengths of light emitted. These emissions can be detected by various photosensitive devices for safety, process control or spectroscopic purposes.

Fire detection systems which furnish an electrical output signal in response to a sudden flame or explosion are well known. Such systems are available on the open market, but are high cost items. One of the reasons for this high cost has been the low sensitivity from available detectors as well as the high cost of detector manufacture. The low sensitivity results in low signal to noise ratio of the system which causes a high rate of false alarms. To circumvent the problem of false alarms, the use of individual detectors having different spectral responses has been taught by Kern, et al (see U. S. Patents to Kern et al.: #4,296,324 entitled "DUAL SPECTRUM INFRARED FIRE SENSOR", issued Oct. 20, 1981; #4,691,196 entitled "DUAL SPECTRUM FREQUENCY RESPONDING FIRE SENSOR", issued Sep. 1, 1987; #4,769,775 entitled "MICROPROCESSOR-CONTROLLED FIRE SENSOR", issued Sep. 6, 1988; and #4,785,292 entitled "DUAL SPECTRUM FREQUENCY RESPONDING FIRE SENSOR", issued Nov. 15, 1988). In addition, intensity comparisons have been made between UV and IR wavelengths to further reduce false alarms. Complex microprocessor logic has been employed to analyze the flicker frequency of the radiation to distinguish a flame from background IR emission.

Axmark, et al (see U.S. Patent to Axmark et al. #4,370,557 entitled "DUAL DETECTOR FLAME SENSOR" issued Jan. 25, 1983) teaches a system using dual, individual, dissimilar detectors for the control of a multi-burner boiler or industrial furnace installation. The detectors used in Axmark were a silicon (Si) detector responsive to visible light and an IR responsive lead-sulfide (PbS) detector with emphasis on the use of both the direct current (dc) and alternating current (ac) responses of these detectors.

In medical research and chemical analysis, IR spectroscopy is often useful. Instruments to perform this type of analysis typically cost $10,000.00 in 1994 U.S. dollars.

Military applications are another expensive use of IR detection systems. Such systems are generally used for IR imaging similar to radar or for the guidance of heat seeking missiles. Although many different materials are used for these detectors, one of these is mercury-cadmium-telluride, HgCdTe, hereafter referred to as MCT. MCT detectors are cooled well below atmospheric temperatures, typically 77° Kelvin, to accomplish detectivity of targets near atmospheric temperature.

SUMMARY OF THE INVENTION

This is an uncooled HgCdTe IR sensor, and method of fabricating an uncooled HgCdTe IR sensor with an integral optical element. The method comprises; growing an HgCdTe film on an IR transparent substrate, and shaping the substrate into a lens configuration. The HgCdTe IR sensor can comprise an epitaxial, HgCdTe film on an IR transparent substrate, with the substrate shaped in a lens configuration, creating an integral, controlled (e.g. wide angle) field of view sensor. Reflections at the interface between the HgCdTe and the lens are substantially reduced, and problems of attaching HgCdTe to the lens are also substantially reduced.

Preferably, the HgCdTe film is grown by liquid phase epitaxy, the substrate is CdZnTe or CdTe, and/or the substrate is shaped into a hemisphere or a cylindrical section. In one embodiment, an IR transparent overlayer is grown on the HgCdTe film and the IR transparent overlayer is also shaped into a lens configuration. The HgCdTe film may also have a top surface with a non-uniform compositional gradient, to provide an HgCdTe IR sensor which can detect a wide range of optical wavelengths.

The present invention applies MCT (HgCdTe) detectors in an uncooled environment for, e.g., the detection and control of open flames as well as for IR spectrographic analysis. As previously noted in co-pending patent application titled MERCURY CADMIUM TELLURIDE DEVICES FOR DETECTING AND CONTROLLING OPEN FLAMES, Ser. No. 60/014,852 (TI Case No TI-16934) filed herewith and incorporated by reference herein, several advantages accrue over conventional systems due to (1) the elimination of cryogenic cooling equipment, (2) the use of mature semiconductor fabrication technology, (3) the greatly improved signal to noise ratios over other pyrolytic flame detectors and (4) the ability to tune the IR response by controlling the relative amounts of Hg, Cd and Te in the detector composition. Embodiments of this co-pending application also use mechanical angle lapping with a diamond point turning (DPT) machine to form novel three dimensional structures. In addition, several embodiments use an IR transparent substrate of CdTe or CdZnTe.

In the use of IR detection for such applications as flame detection, process control or spectroscopy some arrangement of optical elements such as lenses, mirrors, prisms, fiber optics and the like is necessary to control the field of view to the area of interest. In a warehouse fire detection instrument, for example, a wide angle field of view is most often desired. Embodiments of this invention include an IR transparent substrate shaped in a semicircular cross section for wide angle detection as well as two such lenses to give an almost 360° field of view.

In an IR spectrometer, an enlarged narrow field of view is desired. Other embodiments show that the IR transparent substrate can be used as an element of a compound lensing system in a geometric form. Conversely, a narrowed field of view can be provided by a concave lens.

In the IR detection of moving objects or enhanced detection of flickering flames, some form of interference grating may be used. Other embodiments of this invention show that these optical elements can be fabricated as an integral part of the IR transparent substrate.

In one embodiment, different compositions of mercury cadmium telluride are fabricated on a deposition template by liquid phase epitaxial growth where the composition varies with time during the growth of the film and a top portion of the film is lapped at an angle to provide a first lapped surface and a bottom portion of the film and the deposition template are lapped away to provide a sensor of varying composition second lapped surface substantially parallel to the first lapped surface (such a process is described in more detail in the aforementioned concurrently filed application entitled MERCURY CADMIUM TELLURIDE DEVICES FOR DETECTING AND CONTROLLING OPEN FLAMES, Ser. No. 60/014,852 (TI Case No TI-16934). The varying composition allows the detection of a wide range of optical wavelengths. A HgTe film can be used on top and bottom surfaces to provide ohmic contacts to allow connection of appropriate instrumentation to the sensor. The lapped film may be adhered to a substrate and the lapped film may be etched to provide sections of different compositions of mercury cadmium telluride with the sections insulated from one another. HgTe film ohmic contacts can then be made, generally with top and bottom contacts to each of the insulated sections.

Generally, this is a method of fabricating an uncooled HgCdTe IR sensor, which comprises; growing an HgCdTe film on an IR transparent substrate (then, in some embodiments, growing an IR transparent overlayer on said HgCdTe film) and shaping the substrate into a lens configuration, thereby creating an intregal, controlled field of view sensor and whereby both reflections at the interface between the HgCdTe and the lens, and problems of attaching HgCdTe to the lens are substantially reduced.

Preferably the HgCdTe film is grown by liquid phase epitaxy or electron beam epitaxy and the substrate is CdZnTe or CdTe. The substrate may be shaped into a hemisphere or a cylindrical section, and the controlled field of view may be a wide angle view. The HgCdTe film may have a top surface with a non-uniform compositional gradient, whereby the HgCdTe IR sensor can detect a wide range of optical wavelengths.

Alternately, this may be an uncooled HgCdTe IR sensor, the sensor comprising an epitaxial, HgCdTe film on an IR transparent substrate, which substrate is shaped in a lens configuration, thereby creating an intregal wide field of view sensor and whereby both reflections at the interface between the HgCdTe and the lens, and problems of attaching HgCdTe to the lens are substantially reduced. The sensor may use a liquid phase epitaxy, IR transparent overlayer on the HgCdTe film; with the IR transparent overlayer shaped in a lens configuration. The HgCdTe IR sensor may be a flame sensor, and the controlled field of view may be a wide angle view.

This invention shows preferred embodiments to realize useful optical elements from the same fabrication machines and atomic elements used in the fabrication of uncooled MCT IR detectors. While this provides a useful economy in device manufacture, it also provides novel optical elements such as combined spectral filters with geometric optical lenses as an integral part of the IR transparent substrate material such as the CdTe and CdZnTe previously cited.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

This description of some of the preferred embodiments of this invention will be aided by referral to FIGS. 1–4. For clarity of illustration, the devices illustrated are neither to absolute or relative scale. The MCT IR sensing films and filters are not described in detail here. Any of the detector embodiments described with transparent substrates in commonly assigned and co-filed application, Ser. No. 60/014, 852 entitled "MERCURY CADMIUM TELLURIDE DEVICES FOR DETECTING AND CONTROLLING OPEN FLAMES" filed herewith are considered as suitable for these embodiments.

Flame sensors are often used to survey wide areas. Therefore, methods of increasing the field of view can enhance performance. Below are described some concepts based on LPE or similar films with large compositional gradient which makes possible the fabrication of a multi-spectral device from a single deposited film; but it should be understood that this is an example, only, and that other structures such as multi layer structures are equally applicable. Also, the following describes lensing action from domes or cylinders fabricated from CdTe or CdZnTe. These are expected to be of low cost and therefore preferable (also these materials are present at the time of MCT growth) but other materials which might offer other advantages (such as optical filtering) are also possible.

Figure 1:
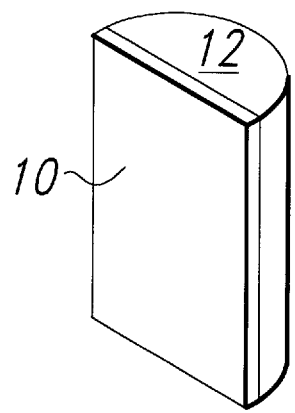
FIG. 1 is a sketch of an MCT sensor with a thick IR transparent substrate geometrically shaped to capture a wide field of view.
Figure 2:
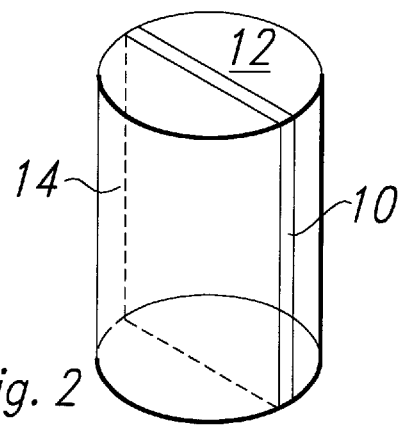
FIG. 2 shows a cylindrical lens configuration with an IR transparent cylinder surrounding the MCT sensor which captures IR radiation e.g. from almost every horizontal angle surrounding it.

Shaping the CdZnTe substrate into a dome or cylinder to create a lens action. An integrated dome-sensor structure could be easily fabricated by growing a LPE film on a suitably thick substrate, dicing the substrate, diamond point turning the LPE surface at an angle to give a composition gradient across the surface (which with additional processing gives it multi-spectral capabilities), and then shaping the substrate. Note there are a number of techniques to achieve the desired structure. One of the easiest is multi-axis diamond point turning FIG. 1 shows the final product with cylindrical geometry. FIG. 2 shows views of a flame sensor incorporating two half-cylindrical lenses to create a full-cylindrical geometry to allow simultaneous detection from front or back.

In FIG. 1, an MCT detector assembly is made from selected layer thicknesses and MCT material compositions to achieve the desired IR spectral response. MCT detector film 10 is deposited by liquid phase epitaxial, molecular beam epitaxy or other suitable means on substrate 12 which is an IR transparent material, such as CdTe or CdZnTe, and is physically thick enough and robust enough to be milled into a geometric lens shape by means, e.g., of a diamond point turning machine. This novel structure is particularly suited to wide field of view applications such as warehouse flame detection systems. As MCT film 10 is grown directly on substrate 12, an intregal, controlled field of view sensor is formed and reflections at the interface between the HgCdTe and the lens, and problems of attaching HgCdTe to the lens are both substantially reduced.

FIG. 2 extends the geometry of FIG. 1 to a field of view to almost 360°, e.g. of horizontal view. To the previously described components is added an additional IR transparent lens 14. Because the MCT detector film 10 can be configured to be sensitive on both surfaces, a cylindrical lens provides very wide coverage. As the IR transparent lens 14 can be grown directly on the MCT film, an integral lens-detector assembly with lenses directly grown on both top and bottom surfaces of the MCT film 10 can be provided.

Figure 3:
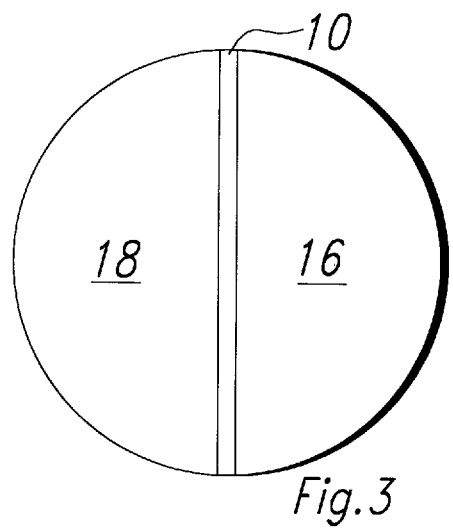
FIG. 3 is a lens configuration made from an IR transparent substrate an IR transparent overlayer which a substrate and an overlayer are both shaped as hemispherical lenses to capture IR radiation from almost every angle.

In FIG. 3 shows an uncooled HgCdTe IR sensor, an HgCdTe film 10 has been grown on an IR transparent substrate, an IR transparent overlayer on HgCdTe film 10, and the substrate has been shaped into hemispherical lens 16 and the IR transparent overlayer has been shaped into hemispherical lens 18, creating an intregal, controlled field of view sensor with essentially complete spherical coverage. Reflections at the both interfaces (between the HgCdTe film 10 and each of the two lenses 16, 18), as well as problems of attaching HgCdTe film 10 to the lenses 16, 18 are substantially reduced. Preferably, both the HgCdTe film 10 and the IR transparent overlayer (which is later shaped into lens 18) are grown by liquid phase epitaxy. Also preferably, both said substrate (which is later shaped into bottom lens 16) and the IR transparent overlayer (which is later shaped into top lens 18) are CdZnTe or CdTe. This HgCdTe IR sensor is especially useful as a wide angle view flame sensor.

Figure 4:
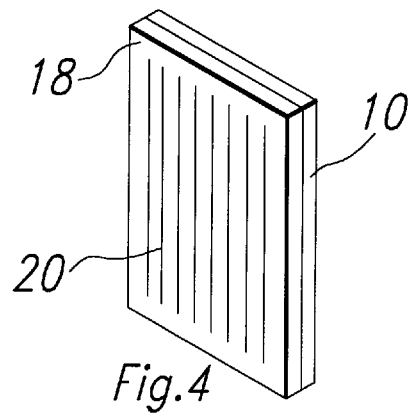
FIG. 4 shows a grating configuration which may be used to enhance detection of moving IR emitters or for the detection of flickering flames.

FIG. 4 represents a form of optical grating 3 whereby the substrate 18 has been patterned with an interference filter 20. In this case a moving source of IR radiation impinging on 20 will cause the intensity of the IR intercepted by 10 to be modulated, i.e. to increase and decrease intensity periodically with the IR source's movement. This could be used to advantage to sense flickering flames for further data processing or for factory control applications.

A wide choice of fabrication techniques is another advantage claimed for this invention. Embodiments of this invention allow deposition of MCT films to be performed by the well known semiconductor processes of metal-organo chemical vapor deposition (MOCVD) and molecular beam epitaxial growth (MBE). Preferably, however, MCT films are deposited by the method of liquid phase epitaxial growth (LPE) and this method is generally used in the examples herein.

While this invention has been described with reference to illustrative embodiments, this description is not intended to be construed in a limiting sense. For example, although the drawings depict single optical elements, multiple elements are not excluded. More than one MCT detector may be present on the substrate surface so more than one lens element could be formed on the other side of the substrate to focus the target IR radiation on each detector. Although embodiments of specific manufacturing control applications were not detailed, the comparison of IR intensities at specific wavelengths and directions of origin can implement highly complex manufacturing control systems at quite economic costs. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A method of fabricating an uncooled HgCdTe IR sensor, said method comprising:

a) growing an HgCdTe film on an IR transparent substrate; and b) shaping said substrate into a lens configuration, thereby creating an intregal, controlled field of view sensor and whereby both reflections at the interface between the HgCdTe and the lens, and problems of attaching HgCdTe to the lens are substantially reduced.

2. The method of claim 1, wherein said HgCdTe film is grown by liquid phase epitaxy or electron beam epitaxy.

3. The method of claim 2, wherein said substrate is CdZnTe or CdTe.

4. The method of claim 1, wherein said substrate is CdZnTe or CdTe.

5. The method of claim 1, wherein said substrate is shaped into a hemisphere.

6. The method of claim 1, wherein said substrate is shaped into a cylindrical section.

7. The method of claim 1, wherein said HgCdTe film has a top surface with a non-uniform compositional gradient, whereby said HgCdTe IR sensor can detect a wide range of optical wavelengths.

8. The method of claim 1, wherein said HgCdTe IR sensor is a flame sensor, and said controlled field of view is a wide angle view.

9. A method of fabricating an uncooled HgCdTe IR sensor, said method comprising:

a) growing an HgCdTe film on an IR transparent substrate;

b) growing an IR transparent overlayer on said HgCdTe film; and c) shaping both said substrate and said IR transparent overlayer into a lens configurations, thereby creating an intregal, controlled field of view sensor and whereby reflections at the interfaces between the HgCdTe and the lenses, and problems of attaching HgCdTe to the lenses are substantially reduced.

10. The method of claim 9, wherein both said HgCdTe film and said IR transparent overlayer are grown by liquid phase epitaxy.

11. The method of claim 10, wherein both said substrate and said IR transparent overlayer are CdZnTe or CdTe, and, wherein said HgCdTe IR sensor is a flame sensor, and wherein said controlled field of view is a wide angle view.

12. The method of claim 9, wherein both said substrate and said IR transparent overlayer are CdZnTe or CdTe.

13. The method of claim 9, wherein both said substrate and said IR transparent overlayer are shaped into hemispheres.

14. The method of claim 9, wherein both said substrate and said IR transparent overlayer are shaped into cylindrical sections.

15. An uncooled HgCdTe IR sensor, said sensor comprising an epitaxial, HgCdTe film on an IR transparent substrate, which substrate is shaped in a lens configuration, thereby creating an intregal wide field of view sensor and whereby both reflections at the interface between the HgCdTe and the lens, and problems of attaching HgCdTe to the lens are substantially reduced.

16. The sensor of claim 15, wherein said substrate is CdZnTe or CdTe.

17. The sensor of claim 15, wherein said substrate is shaped into a hemisphere.

18. The sensor of claim 15, wherein said substrate is shaped into a cylindrical section.

19. The sensor of claim 15, wherein a liquid phase epitaxy, IR transparent overlayer is on said HgCdTe film; and said IR transparent overlayer is shaped in a lens configuration.

20. The sensor of claim 19, wherein both said substrate and said IR transparent overlayer are shaped into hemispheres.

21. The sensor of claim 20, wherein said HgCdTe film has a top surface with a non-uniform compositional gradient, whereby said HgCdTe IR sensor can detect a wide range of optical wavelengths.

* * * * *